United States Patent [19]
Hida

[11] Patent Number: 5,686,740
[45] Date of Patent: Nov. 11, 1997

[54] FIELD EFFECT TRANSISTOR WITH RECESSED GATE

[75] Inventor: Hikaru Hida, Tokyo, Japan

[73] Assignee: NEC Corporation, Tokyo, Japan

[21] Appl. No.: 542,616

[22] Filed: Oct. 13, 1995

[30]      Foreign Application Priority Data

Oct. 13, 1994   [JP]   Japan ................................ 6-247928

[51] Int. Cl.$^6$ ..................... H01L 31/0328; H01L 31/0336
[52] U.S. Cl. ............................................ 257/192; 257/194
[58] Field of Search ................................ 257/192, 194, 257/280, 284, 285

[56]          References Cited

U.S. PATENT DOCUMENTS 4,593,301   6/1986   Inata et al. ............................. 257/194
5,181,087   1/1993   Usagawa et al. ...................... 257/284

FOREIGN PATENT DOCUMENTS 61-270873   12/1986   Japan ..................... 257/194

*Primary Examiner*—Wael Fahmy
*Attorney, Agent, or Firm*—Young & Thompson

[57]          ABSTRACT

In an FET structure, an n-type AlGaAs electron supplying layer is provided above a GaAs channel layer, and a low-resistivity n-type GaAs contact layer (the first semiconductor layer) is provided between the source/drain electrode and the electron supplying layer. A high-resistivity AlGaAs layer (the second semiconductor layer) is formed on the sidewalls of the contact layer and the immediately adjacent region between the gate electrode and the contact layer. According to the present invention, since a semiconductor film is used as the thin film formed on the sidewall and the adjacent electron supplying layer instead of a conventional insulating film, and moreover since AlGaAs is substantially lattice matched to GaAs and has a larger band width, parasitic resistance is reduced significantly, and the fluctuation of device performance properties is prevented while still maintaining high breakdown voltage. A semiconductor layer having a conduction type opposite that of the contact layer may also be used in place of the high resistivity AlGaAs layer.

21 Claims, 5 Drawing Sheets

FIELD EFFECT TRANSISTOR WITH RECESSED GATE

BACKGROUND OF THE INVENTION

1. Field of the Invention

The present invention relates to a field effect transistor (FET) and, more specifically to an FET having a novel recessed gate structure to attain high breakdown voltage and a low parasitic resistance, and a method for the manufacture thereof.

2. Description of Related Art

Development of high frequency microwave devices, as well as high speed, low power consumption LSIs using FETs made of compound semiconductors such as GaAs are being actively pursued. Among these efforts, the reduction of parasitic resistance and increase in breakdown voltage are critical for improving the performance and reliability of these small dimension devices.

Heretofore, methods in which an FET of a recessed gate structure is coated by an insulation film have been used for the reduction of parasitic resistance and increase in breakdown voltage. For example, U.S. Pat. No. 5,181,087 discloses a field effect transistor with reduced parasitic source/drain resistance by adopting a recessed gate structure, and with increased breakdown voltage by forming a dielectric insulation film such as $SiO_2$ and SiN between the gate electrode and the source/drain electrode. The '087 patent also discloses a method for manufacturing such an FET.

Although the breakdown voltage is improved in such a conventional field effect transistor, because of the use of a dielectric film different from a semiconductor layer, the problem of the large fluctuation in device performance properties has not been solved. This phenomenon is known to be significant when a III-V compound semiconductor such as GaAs is used.

It is therefore, an object of the present invention to solve the problems in the prior art, and to provide a field effect transistor with a high breakdown voltage and a low parasitic resistance, and a method for the manufacture of such a field effect transistor.

BRIEF SUMMARY OF THE INVENTION

A field effect transistor according to the present invention is a recessed gate FET having a first low-resistance semiconductor layer above the channel with a second semiconductor layer having a conduction characteristic different from that of the first low-resistance semiconductor layer formed on the sides of the first semiconductor layer and on at least a part of a region between the gate electrode and the first low-resistance semiconductor layer, and optionally in addition to these, immediately under the gate electrode.

A method for the manufacture of the field effect transistor according to the present invention comprises the steps of: forming a semiconductor layer that is to become a channel through which carriers will flow; forming a first low-resistance semiconductor layer; removing a part of the first semiconductor layer to form an opening; and forming a second semiconductor layer on a part of or the entire surface in the opening.

BRIEF DESCRIPTION OF THE DRAWINGS

The above-mentioned and other objects, features and advantages of this invention will become more apparent by reference to the following detailed description of the invention taken in conjunction with the accompanying drawings, wherein.

DETAILED DESCRIPTION OF THE PREFERRED EMBODIMENTS

Figure 1:
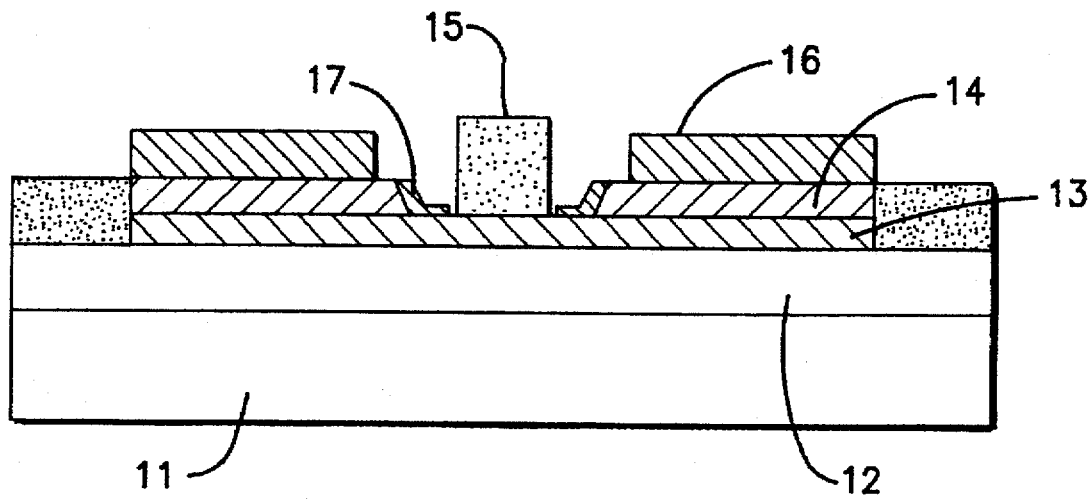
FIG. 1 is a schematic sectional view showing a field effect transistor according to an embodiment of the present invention.

The present invention will be described in detail referring to the drawings. FIG. 1 is a schematic sectional view showing a field effect transistor according to a first embodiment of the present invention. An undoped GaAs channel layer 12 of a film thickness of about 500 nm, and an n-type AlGaAs electron supplying layer 13 of a film thickness of about 40 nm and a Si donor concentration of about $2 \times 10^{18}$ $cm^{-3}$ are formed on a semi-insulating GaAs substrate 11. Over the electron supplying layer 13, an n-type GaAs contact layer (the first semiconductor layer) 14 of a film thickness of about 100 nm and a Si donor concentration of about $4 \times 10^{18}$ $cm^{-3}$ is formed having an opening exposing the electron supply layer 13 beneath it. A WSi gate electrode 15 is formed in that opening in contact with the electron supply layer 13. AuGe/Ni/Au ohmic electrodes 16 are formed on the GaAs contact layer 14 on both sides of the gate electrode 15. On both sides of the gate electrode 15, a high-resistivity semiconductor layer 17, which is substantially lattice matched to GaAs with a band width larger than the band width of GaAs, is formed contiguously in contact with the side surfaces of the contact layer 14 exposed in the opening, and the adjacent electron supplying layer 13 near the gate electrode 15. Specifically, a high-resistivity undoped AlGaAs layer (the second semiconductor layer) 17 of a film thickness of about 30 nm is formed. As is well known to people skilled in the art, a composition for the n-type AlGaAs electron supplying layer 13 and the high resistivity undoped AlGaAs layer 17 would typically be, but is not restricted to, $Al_{0.3}Ga_{0.7}As$ and $Al_{0.5}Ga_{0.5}As$, respectively.

Next, a second embodiment of the present invention will be described. This embodiment has the same essential features as the first embodiment except differences in the material composition of the semiconductor layers and electrodes. Referring to the same FIG. 1, the second embodiment of the present invention comprises a semi-insulating GaAs substrate 11, an undoped InGaAs channel layer 12 of a film thickness of about 500 nm, an n-type AlInAs electron supplying layer 13 of a film thickness of about 30 nm and a Si donor concentration of about $3 \times 10^{18}$ $cm^{-3}$, an n-type InGaAs contact layer (the first semiconductor layer) 14 of a film thickness of about 50 nm and a Si donor concentration of about $7 \times 10^{18}$ $cm^{-3}$, a W/Ti/Pt/Au gate electrode 15 formed within an opening formed in the contact layer 14 to contact the electron supplying layer 13 underneath, Wsi/Ti/

Pt/Au ohmic electrodes 16, and an undoped high-resistivity AlInAs layer 17 of a film thickness of about 5 nm formed on both sides of the gate electrode and contiguously in contact with the exposed side surface of the contact layer 14 and the adjacent electron supplying layer 13 near the gate electrode 15. As is well known to people skilled in the art, a composition for the undoped InGaAs channel layer 12, the n-type InGaAs contact layer 14, the n-type AlInAs electron supplying layer 13, and the high-resistivity undoped AlInAs layer would typically be, but is not restricted to $In_{0.5}Ga_{0.5}As$, $In_{0.5}Ga_{0.5}As$, $Al_{0.3}In_{0.7}As$ and $Al_{0.5}In_{0.5}As$, respectively.

Next, a third embodiment of the present invention will be described. This embodiment is an example in which, instead of a high-resistivity layer, a semiconductor layer having a conduction type opposite to the conduction type of the contact layer is formed as layer 17 in a MESFET structure. Referring to the same FIG. 1, the third embodiment of the present invention comprises a semi-insulating GaAs substrate 11, an undoped GaAs layer 12 of a film thickness of about 500 nm, an n-type GaAs layer 13 of a film thickness of about 100 nm and a Si donor concentration of about $2 \times 10^{17}$ $cm^{-3}$, an n-type GaAs contact layer 14 of a film thickness of about 200 nm and a Si donor concentration of about $4 \times 10^{18}$ $cm^{-3}$, a Ti/Al gate electrode 15 formed within an opening formed in the contact layer 14 to contact the n-type GaAs layer 13 underneath, AuGe/Ni/Au ohmic electrodes 16, and a p-type GaAs layer 17 of a film thickness of about 100 nm and an acceptor concentration of about $1 \times 10^{19}$ $cm^{-3}$ formed on both sides of the gate electrode and contiguously in contact with the side surfaces of the n-type GaAs contact layer 14 and the adjacent n-type GaAs layer 13 near the gate electrode 15.

Next, a fourth embodiment of the present invention will be described. Referring to the same FIG. 1, the fourth embodiment of the present invention comprises a semi-insulating GaAs substrate 11, an undoped GaAs buffer layer 12 of a film thickness of about 500 nm, an undoped Ge layer 13 of a film thickness of about 30 nm, a p-type GaAs contact layer 14 of a film thickness of about 40 nm and an acceptor concentration of about $5 \times 10^{18}$ $cm^{-3}$, a Wsi gate electrode 15, a GeNi ohmic electrode 16, and an undoped GaAs layer 17 of a film thickness of about 50 nm formed contacting the side of the contact layer 14, and the continuing Ge layer 13 near the gate electrode 15.

Next, a fifth embodiment of the present invention will be described. Referring to the same FIG. 1, the fifth embodiment of the present invention comprises a semi-insulating GaAs substrate 11, an undoped GaAs buffer layer 12 of a film thickness of about 500 nm, an undoped Ge layer 13 of a film thickness of about 30 nm, a p-type GaAs contact layer 14 of a film thickness of about 40 nm and an acceptor concentration of about $5 \times 10^{18}$ $cm^{-3}$, a Wsi gate electrode 15 formed within an opening formed in the p-type GaAs contact layer 14 to contact the undoped Ge layer 13 underneath, AuZn ohmic electrodes 16, and an n-type GaAs layer 17 of a film thickness of about 200 nm and a Si donor concentration of $1 \times 10^{19}$ $cm^{-3}$ formed on both sides of the gate electrode and contiguously in contact with the exposed side surface of the p-type GaAs contact layer 14 and the adjacent Ge layer 13 near the gate electrode 15.

Next, a method for the manufacture of the field effect transistor according to the present invention will be described referring to FIG. 2(a)–FIG. 2(e). This will also serve to describe the sixth embodiment.

Figure 2A:
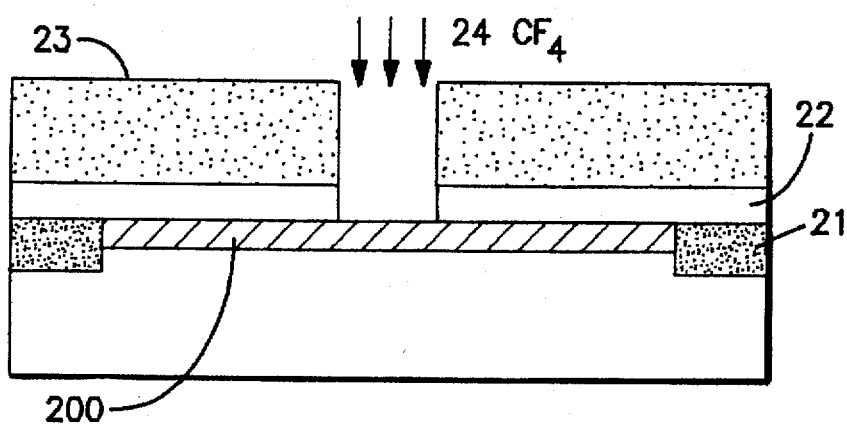
FIGS. 2(a)-2(e) form a process flow diagram showing the manufacturing process of the field effect transistor according to another embodiment of the present invention.
Figure 2B:
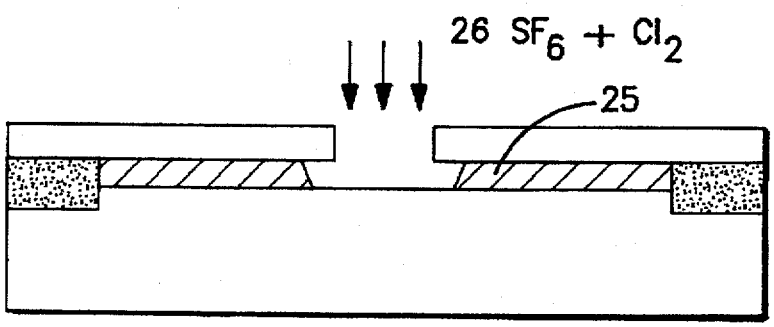

First, as FIG. 2(a) shows, an undoped GaAs layer of a film thickness of about 500 nm, an undoped InGaAs layer of a film thickness of about 15 nm, a Si doped, n-type AlGaAs electron supplying layer of a Si donor concentration of about $3 \times 10^{18}$ $cm^{-3}$ and a film thickness of about 25 nm, and an n-type GaAs contact layer 25 of a film thickness of about 100 nm and a Si donor concentration of about $4 \times 10^{18}$ $cm^{-3}$ are formed sequentially in that order, on a semi-insulating GaAs substrate using the molecular beam epitaxy (MBE) method. In FIG. 2(a), these four layers are collectively shown as one layer 200 to avoid complication. After these steps, the top surface of layer 200 is partially masked using a photoresist and photolithography, and boron is selectively implanted to form a device separation region 21. Then silicon oxide film 22 (typically $SiO_2$) of a thickness of about 300 nm is deposited using the CVD method, and after patterning the photoresist (PR) 23 using photolithography, the $SiO_2$ film 22 is subjected to dry etching, such as conventional reactive ion etching (RIE), using $CF_4$ gas 24 to form an opening of about 0.5 µm in width. A typical RIE condition would be 20 sccm of $CF_4$ gas flow, gas pressure of 5 mTorr, and RF power of 50 W. Then, as FIG. 2(b) shows, a part of the low-resistivity n-type GaAs contact layer 25 is selectively etched by $SF_6$ and $Cl_2$ gases 26 using the $SiO_2$ film 22 as the etching mask. This etching process is chemical in nature so that it results in a lateral etching called "side etching", leaving overhanging eaves of the $SiO_2$ film 22.

Figure 2C:
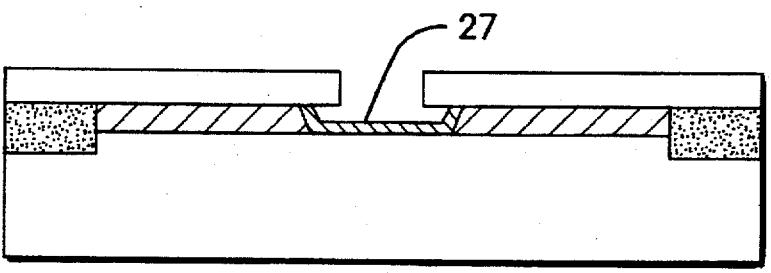

Next, as FIG. 2(c) shows, a high-resistivity undoped AlGaAs layer 27 of a film thickness of about 100 nm is selectively grown in the opening using the metal organic molecular beam epitaxy (MOMBE) method. By using MOMBE, the AlGaAs layer 27 grows in such a way as to fill in the side etched portion under the $SiO_2$ film eaves. The Al content of this AlGaAs layer 27 is chosen to be lower than that of the underlying n-type AlGaAs electron supplying layer. Specifically, the Al content of the AlGaAs layer 27 is about 30% and that of the underlying n-type AlGaAs electron supplying layer is about 50%. Then, using the overhanging eaves of the $SiO_2$ film 22 as a mask, a central portion of the AlGaAs layer 27 is removed by an anisotropic reactive dry etching using a mixed gas of chlorine and He. The etching rate of AlGaAs for this dry etching is larger for smaller amounts of Al content. Since the Al content of the AlGaAs layer 27 is lower than that of the underlying electron supplying layer, its etching rate is larger than that of the electron supplying layer. Thus, only the AlGaAs layer 27 can be removed without removing any of or much of the electron supplying layer. Thus, the AlGaAs layer 27 is left on the sidewalls of the contact layer 25 and the adjacent portion of the electron supplying layer.

Figure 2D:
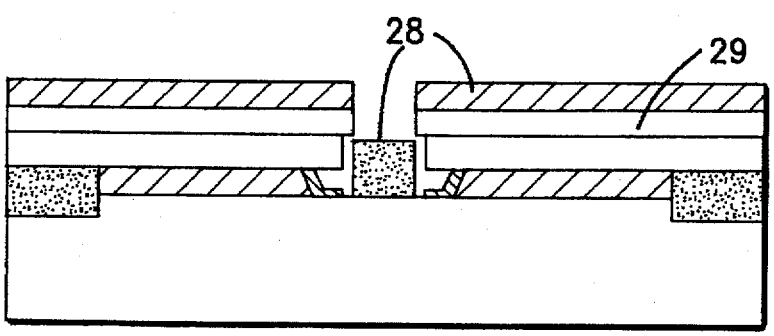

Next, as FIG. 2(d) shows, an Al gate metal 28 is deposited through a photoresist mask 29 having an opening aligned with the opening of the $SiO_2$ film 22. The photoresist mask 29 and its overlying Al 28 are removed by the lift-off method, leaving the Al gate metal 28 in the opening.

Figure 2E:
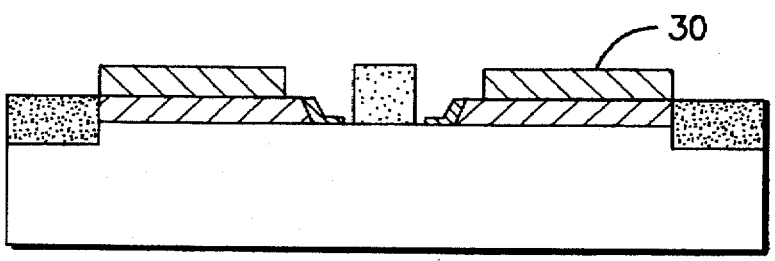

Finally, as FIG. 2(e) shows, after removing the $SiO_2$ film 22, a AuGe/Ni/Au film is deposited using another photoresist mask (not shown), after which undesired portions of the AuGe/Ni/Au film are lifted off as before. The AuGe/Ni/Au film is then heat treated to obtain alloyed type ohmic electrodes which form a source electrode and a drain electrode 30. In the device structure of this embodiment, the gate length was about 0.5 µm, the parasitic resistance was as small as 0.2 Ω-mm or below, and the breakdown voltage was 10 V.

Moreover, since the second semiconductor layer 27 is a semiconductor layer, interface state densities at the interface between the top surface of layer 200 (the electron supplying layer in this embodiment) as well as the contact layer 25 is minimal. Thus the fluctuation of device properties such as conductance and frequency dispersion characteristics, were greatly diminished.

As the second semiconductor layer 27, p-type GaAs or AlGaAs may be used instead of undopeal AlGaAs. Also, in place of selective growth by MOMBE, the sidewalls of the contact layer and the surface of the electron supplying layer may be converted into p-type material by a diffusion method such as solid phase diffusion of Zn, and later etched selectively to leave the required portions. The p-type layer may also be formed by exposing the layer to a reaction gas (e.g. $CF_4$) containing an element that can be a p-type dopant (in case of $CF_4$, carbon). In this case, since some energy must be supplied for forming carbon ions and implanting them into the substrate, an equipment such as a plasma generator using electron cyclotron resonance (ECR) should be used.

In this sixth embodiment, the second semiconductor layer 27 was formed before forming the gate electrode 28. However, it may be formed after the gate electrode 28 has been formed. In that case, it is preferred that a refractory metal with relatively high tolerance to heat such as W, Wsi, WAl, WN, Mo or their compounds be selected as a material for the gate electrode in order to prevent the deterioration of the metal's performance as a gate electrode and also of the quality of the semiconductor layer immediately under the gate electrode. Furthermore, it is preferred that the second semiconductor layer 27 is selectively formed by using methods such as MOMBE or metal-organic chemical vapor deposition (MOCVD). It is also preferred to use spatially selective methods in the cases where the diffusion method or the like is adopted.

Figure 3A:
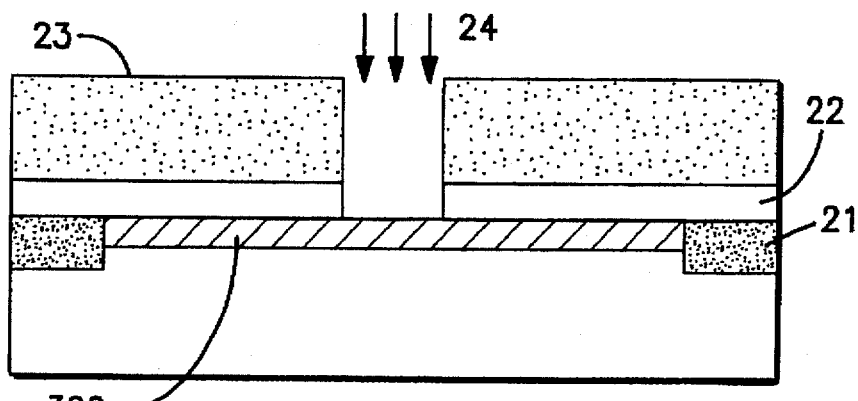
FIGS. 3(a)-3(e) form a process flow diagram showing the manufacturing process of the field effect transistor according to another embodiment of the present invention.

Next, a seventh embodiment of the present invention will be described. As FIG. 3(a) shows, an undoped GaAs layer of a film thickness of about 500 nm, an n-type AlGaAs electron supplying layer of a Si donor concentration of about $3 \times 10^{17}$ cm$^{-3}$ and a film thickness of about 100 nm, and an n-type GaAs contact layer (the first semiconductor layer) of a film thickness of about 100 nm and a Si donor concentration of about $5 \times 10^{18}$ cm$^{-3}$ are grown sequentially on a semi-insulating GaAs substrate using molecular beam epitaxy (MBE). These MBE grown layers are collectively marked as layer 300 in the figures. After these steps, the top surface of the layer 300 (contact layer 25) is partially masked using a photoresist, and oxygen is selectively implanted to form a device separation region 21. Then an SiO$_2$ film 22 of a thickness of about 300 nm is deposited using the CVD method. After this, a part of the SiO$_2$ film 22 is removed using a photoresist mask 23 and dry etching with $CF_4$ gas 24 to form an opening therein.

Figure 3B:
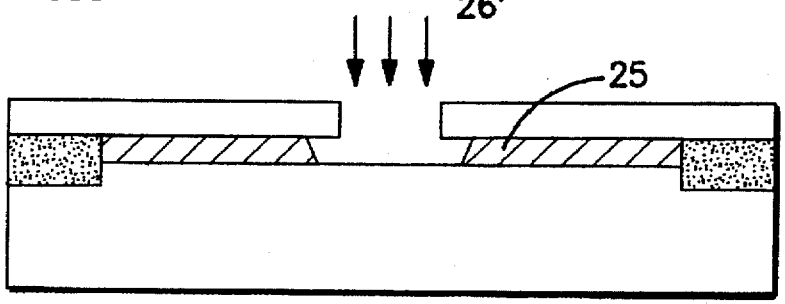

Next, as shown in FIG. 3(b), the photoresist 23 is removed, and the n-type GaAs contact layer 25 is selectively etched through the opening in the SiO$_2$ film 22 using Cl$_2$ gas 26'.

Figure 3C:
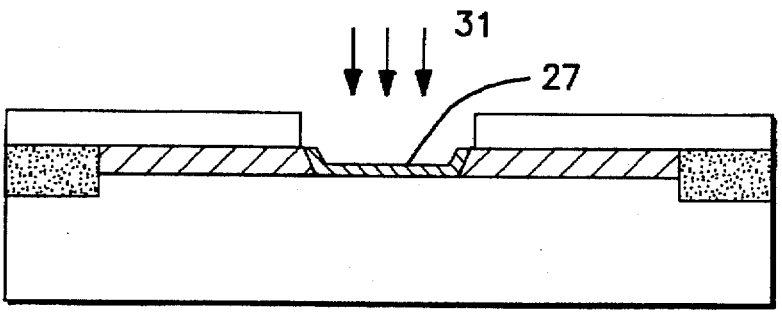

Next, as FIG. 3(c) shows, the SiO$_2$ film 22 is etched using a buffered HF solution to expose at least the sidewall of the contact layer 25 from under the SiO$_2$ eaves. This is accomplished by the etching proceeding in the lateral direction. Then, carbon ions 31 are implanted using ion implantation, after which the structure is heat-treated at 800° C. to electrically activate and convert the sidewall of the contact layer 25 and the surface of the n-type AlGaAs electron supplying layer to become the p-type layer 27.

Figure 3D:
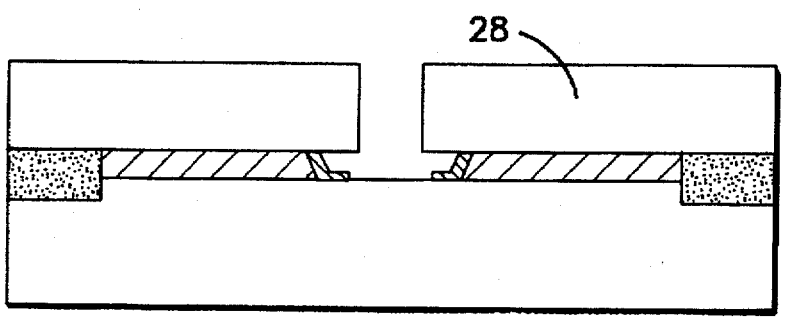

Thereafter, as FIG. 3(d) shows, a central part of the p-type layer 27 is etched off anisotropically using a photoresist mask 29, leaving the p-type layer only on the sidewall of the contact layer 25 and the surface of the adjacent electron supplying layer. The exposed central portion forms the gate electrode forming region.

Figure 3E:
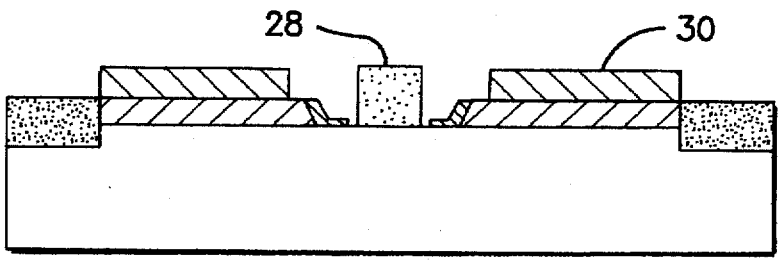

Finally, as FIG. 3(e) shows, a Wsi gate electrode 28 is formed in the aforementioned gate electrode forming region. AuGe/Ni/Au is evaporated, and then patterned using the lift-off technique, and heat treated to form alloyed ohmic electrodes which become the source and the drain electrodes 30.

Figure 4:
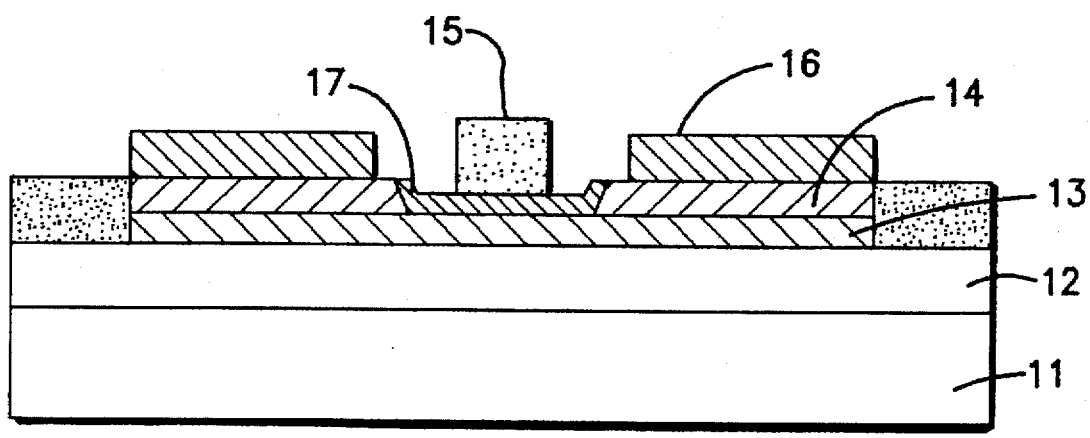
FIG. 4 is a schematic sectional view showing a field effect transistor according to another embodiment of the present invention.

FIG. 4 is a schematic sectional view showing another embodiment of the instant invention. The difference from the embodiment of FIG. 1 is that the second semiconductor layer 17 is formed not only on the sidewall of the first semiconductor layer (contact layer) 14 and on the electron supplying layer 13 between this sidewall and the gate electrode 15, but also under the gate electrode and in between the gate electrode and the electron supplying layer. In other words the second semiconductor layer 17 is formed as one continuous layer between the two contact layers. Of course, it is obvious that the present invention can be applied to the above third, fourth and fifth embodiments.

Previously, the deterioration of breakdown voltage due to the fact that a conducting semiconductor layer is lying immediately under the gate electrode had been difficult to avoid. Even if a high-resistivity layer is inserted underneath the gate electrode during crystal growth, since this high-resistivity layer will not only be present under the gate electrode but also under the ohmic electrode, it has been difficult to reduce ohmic resistance and improve breakdown voltage at the same time. However, when the second semi-conductor layer is provided not only over the sidewalls of the contact layer and the adjacent electron supplying layer but also immediately under the gate electrode, as in the present embodiment, breakdown voltage is further improved over the invention of the embodiment described by FIG. 1.

Figure 5A:
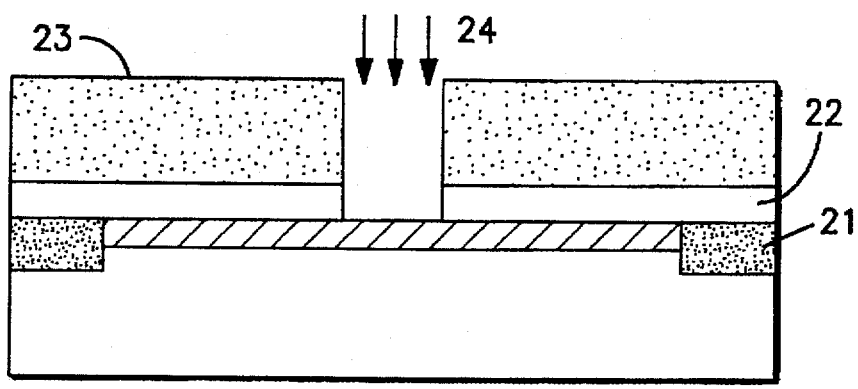
FIGS. 5(a)-5(e) form a process flow diagram showing the manufacturing process of the field effect transistor according to another embodiment of the present invention.
Figure 5B:
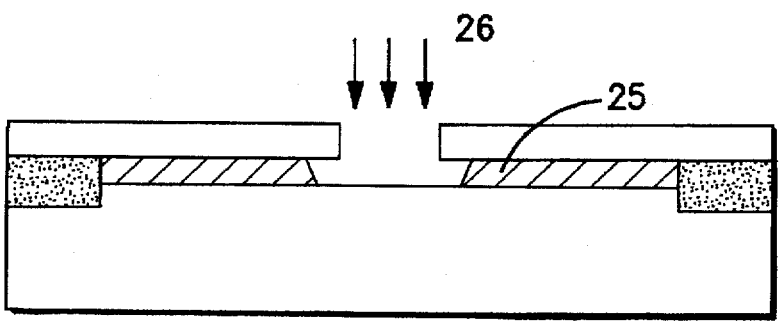
Figure 5C:
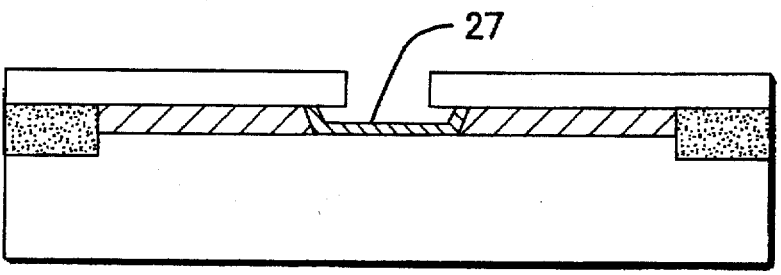
Figure 5D:
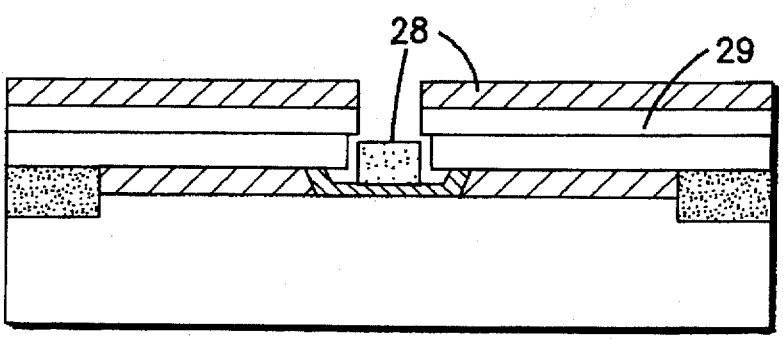
Figure 5E:
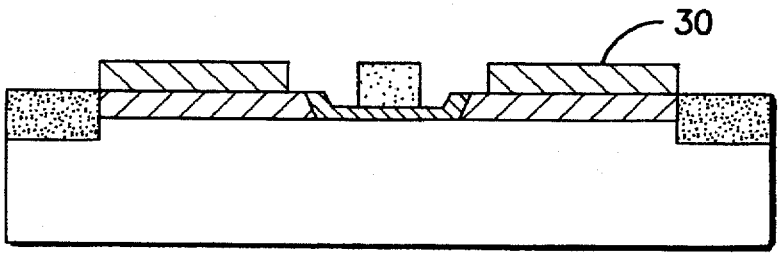

Next, a method for the manufacture of the FET of FIG. 4 will be described referring to FIGS. 5(a)–5(e). Since the steps performed as shown in FIG. 5(a) to FIG. 5(c) are the same as shown in FIG. 2(a) to FIG. 2(c), no description of those drawings is needed. After the step (c), as FIG. 5(d) shows, a gate metal Al 28 is evaporated using photoresist 29 as the mask. Then, the photoresist 29 and the overlying Al 28 are removed by the lift-off method. Finally, as FIG. 5(e) shows, after removing the SiO$_2$ film 22, AuGe/Ni/Au is evaporated using a photoresist (not shown) as the mask, lifted off, and alloyed to form ohmic contacts which become the source and drain electrodes 30.

In the device structure of this embodiment, the gate length was about 0.5 μm, the parasitic resistance was as low as 0.2 Ω-mm or less, and the breakdown voltage was 13 V. The fluctuation of device properties were also significantly reduced.

As the second semiconductor layer 27, p-type GaAs or p-type AlGaAs may be used instead of undoped AlGaAs. Also, in place of selective growth by MOMBE, the sidewalls of the contact layer and the surface of the electron supplying layer may be converted into p-type material by a diffusion method such as solid phase diffusion of Zn, and later etched selectively to leave the required portions. The p-type layer may also be formed by exposing the layer to a reaction gas (e.g. $CF_4$) containing an element that can be a p-type dopant (in case of $CF_4$, carbon). In this case, since some energy must be supplied for forming carbon ions and implanting them into the substrate, an equipment such as a plasma generator using electron cyclotron resonance (ECR) should be used.

Figure 6A:
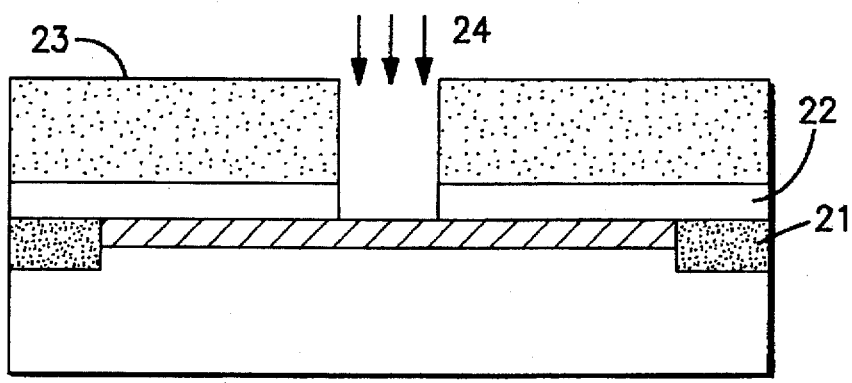
FIGS. 6(a)-6(e) form a process flow diagram showing the manufacturing process of the field effect transistor according to another embodiment of the present invention.
Figure 6B:
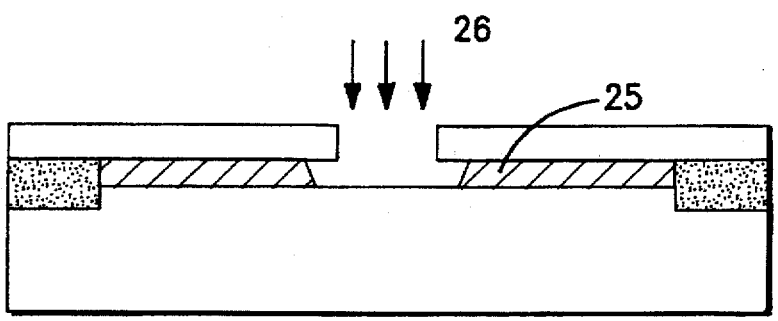
Figure 6C:
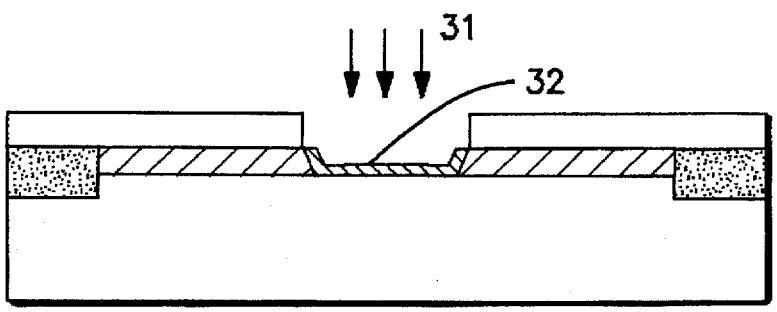
Figure 6D:
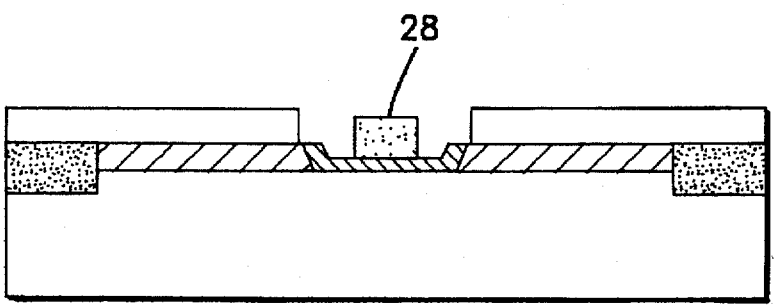
Figure 6E:
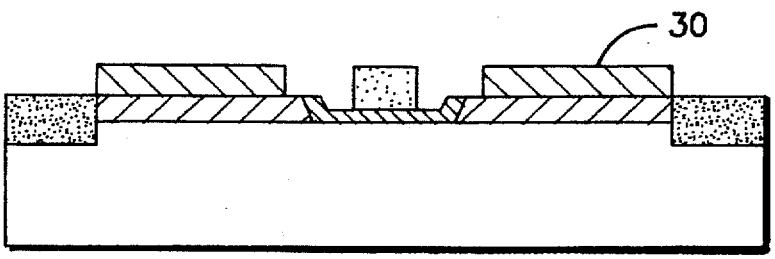

Next, another method for the manufacture of the FET depicted in FIG. 4 will be described referring to FIGS. 6(a)–(e). The steps performed as shown in FIG. 6(a) to FIG. 6(c) are the same as shown in FIG. 3(a) to FIG. 3(c), except that the layers 300 has a different construction. Namely, in FIG. 6(a), an undoped GaAs layer of a film thickness of about 500 nm, an n-type GaAs layer of a Si donor concentration of about $3 \times 10^{17}$ cm$^{-3}$ and a film thickness of about 100 nm, and an n-type GaAs layer of a film thickness of about 100 nm and a Si donor concentration of about $5 \times 10^{18}$ cm$^{-3}$ are grown sequentially on a semi-insulating GaAs substrate using MBE. After these steps, as FIGS. 6(d) and (e) show, Wsi gate electrode is formed, AuGe/Ni/Au is evaporated, lifted off, and alloyed to form a source electrode and a drain electrode which become ohmic electrodes.

In this embodiment and other embodiments requiring implantation of acceptor dopants, ions of acceptor dopant elements other than carbon may also be implanted.

It is obvious that the present invention described above by various embodiments may also be applied to other semiconductor materials including group III–V compound semiconductors such as InP, InAlAs, GaSb, InSb, InAs, AlSb, and GaInP; other doping methods such as atomic layer doping (δ-doping); or channel structures having doping regions.

As described above, a field effect transistor and a method for the manufacture of such a field effect transistor according to the present invention comprise a first low resistivity semiconductor layer with an opening on the surface of a substrate, a semiconductor layer of a high resistivity, or of conduction type opposite that of the first low resistivity semiconductor layer formed on the sidewalls of the first low-resistivity semiconductor layer and at least a part of the region between the gate electrode and the first low-resistivity semiconductor layer sidewall, or in addition to these, on the portion immediately under the gate electrode. Owing to this design, parasitic resistance is reduced significantly and the fluctuation of device performance properties is prevented while still maintaining high breakdown voltage.

What is claimed is:

1. A field effect transistor comprising:
   a channel layer to conduct carriers;
   a source electrode, a drain electrode, and a gate electrode formed or said channel layer;
   a first semiconductor layer interposed between said source electrode and said channel layer, and between said drain electrode and said channel layer, said first semiconductor layer having an opening in which said gate electrode is formed, said opening being defined by oppositely facing sidewalls of said first semiconductor layer;
   a second semiconductor layer having an electrical conductivity different from the electrical conductivity of the first semiconductor layer, said second semiconductor layer being formed on at least one of said sidewalls of the first semiconductor layer and on at least a part of said channel layer between said gate electrode and said sidewall; wherein a conduction type of said second semiconductor layer is opposite to a conduction type of said first semiconductor layer.

2. The field effect transistor as set forth in claim 1, wherein the second semiconductor layer has a band gap equal to or wider than that of said first semiconductor layer, and an electrical resistivity higher than said first semiconductor layer.

3. The field effect transistor as set forth in claim 1, wherein an impurity concentration of said first semiconductor layer is $10^{18}$ cm$^{-3}$ or more.

4. The field effect transistor as set forth in claim 1, wherein said first semiconductor layer is substantially lattice matched with said second semiconductor layer.

5. The field effect transistor as set forth in claim 1, wherein said channel layer comprises:
   an undoped semiconductor layer; and
   an intentionally doped semiconductor layer formed on said undoped semiconductor layer.

6. The field effect transistor as set forth in claim 1, wherein said channel layer comprises:
   an undoped semiconductor layer; and
   an intentionally doped electron supplying layer having an electron affinity smaller than that of said undoped semiconductor layer formed on said undoped semiconductor layer.

7. The field effect transistor as set forth in claim 1, wherein said channel layer comprises:
   an undoped semiconductor layer; and
   a hole supplying layer formed on said undoped semiconductor layer, wherein a sum of electron affinity and band gap of said hole supplying layer is larger than that of said undoped semiconductor layer.

8. A field effect transistor comprising:
   a channel layer to conduct carriers;
   a source electrode, a drain electrode, and a gate electrode formed on said channel layer;
   a first semiconductor layer interposed between said source electrode and said channel layer, and between said drain electrode and said channel layer, said first semiconductor layer having an opening in which said gate electrode is formed, said opening being defined by oppositely facing sidewalls of said first semiconductor layer;
   a second semiconductor layer having an electrical conductivity different from the electrical conductivity of the first semiconductor layer, said second semiconductor layer having a first portion formed on at least one of said sidewalls of said first semiconductor layer and extending continuously to a second portion formed on at least a part of said channel layer adjacent to said sidewall and lying between said gate electrode and said sidewall wherein; a conduction type of said second semiconductor layer is opposite to a conduction type of said first semiconductor layer.

9. The field effect transistor as set forth in claim 8, wherein the second semiconductor layer has a band gap equal to or wider than that of said first semiconductor layer, and an electrical resistivity higher than said first semiconductor layer.

10. The field effect transistor as set forth in claim 8, wherein an impurity concentration of said first semiconductor layer is $10^{18}$ cm$^{-3}$ or more.

11. The field effect transistor as set forth in claim 8, wherein said first semiconductor layer is substantially lattice matched with said second semiconductor layer.

12. The field effect transistor as set forth in claim 8, wherein said channel layer comprises:
   an undoped semiconductor layer; and
   an intentionally doped semiconductor layer formed on said undoped semiconductor layer.

13. The field effect transistor as set forth in claim 8, wherein said channel layer comprises:
   an undoped semiconductor layer; and
   an intentionally doped electron supplying layer having an electron affinity smaller than that of said undoped semiconductor layer formed on said undoped semiconductor layer.

14. The field effect transistor as set forth in claim 8, wherein said channel layer comprises:

an undoped semiconductor layer; and a hole supplying layer formed on said undoped semiconductor layer, wherein a sum of electron affinity and band gap of said hole supplying layer is larger than that of said undoped semiconductor layer.

15. A field effect transistor comprising:

a channel layer to conduct carriers;

a source electrode, a drain electrode, and a gate electrode formed on said channel layer;

a first semiconductor layer interposed between said source electrode and said channel layer, and between said drain electrode and said channel layer, said first semiconductor layer having an opening in which said gate electrode is formed, said opening being defined by oppositely facing sidewalls of said first semiconductor layer;

a second semiconductor layer having an electrical conductivity different from the electrical conductivity of the first semiconductor layer, said second semiconductor layer being formed on at least one of said sidewalls of the first semiconductor layer, on said channel layer in between said sidewall and said gate electrode, and immediately under said gate electrode; wherein a conduction type of said second semiconductor layer is opposite to a conduction type of said first semiconductor layer.

16. The field effect transistor as set forth in claim 15, wherein the second semiconductor layer has a band gap equal to or wider than that of said first semiconductor layer, and an electrical resistivity higher than said first semiconductor layer.

17. The field effect transistor as set forth in claim 15, wherein an impurity concentration of said first semiconductor layer is $10^{18}$ cm$^{-3}$ or more.

18. The field effect transistor as set forth in claim 15, wherein said first semiconductor layer is substantially lattice matched with said second semiconductor layer.

19. The field effect transistor as set forth in claim 15, wherein said channel layer comprises:

an undoped semiconductor layer; and an intentionally doped semiconductor layer formed on said undoped semiconductor layer.

20. The field effect transistor as set forth in claim 15, wherein said channel layer comprises:

an undoped semiconductor layer; and an intentionally doped electron supplying layer having an electron affinity smaller than that of said undoped semiconductor layer formed on said undoped semiconductor layer.

21. The field effect transistor as set forth in claim 15, wherein said channel layer comprises:

an undoped semiconductor layer; and a hole supplying layer formed on said undoped semiconductor layer, wherein a sum of electron affinity and band gap of said hole supplying layer is larger than that of said undoped semiconductor layer.

* * * * *